United States Patent [19]

Fan

[11] 4,072,527

[45] Feb. 7, 1978

[54] OXYGEN BARRIER LAYERS FOR PHOTOPOLYMERIZABLE ELEMENTS

[75] Inventor: Roxyni Fan, East Brunswick, N.J.

[73] Assignee: E. I. Du Pont de Nemours and Company, Wilmington, Del.

[21] Appl. No.: 692,600

[22] Filed: June 3, 1976

Related U.S. Application Data

[63] Continuation-in-part of Ser. No. 292,501, Sept. 27, 1972, abandoned.

[30] Foreign Application Priority Data

| | | |
|---|---|---|
| Sept. 22, 1973 | Germany | 2347784 |
| Sept. 26, 1973 | Belgium | 136064 |
| Sept. 27, 1973 | Japan | 48-108053 |

[51] Int. Cl.$^2$ ..... G03C 1/78

[52] U.S. Cl. ..... 96/87 R; 96/67; 96/50 PL; 96/35.1; 96/86 P

[58] Field of Search ..... 96/87 R, 115 R, 35.1, 96/115 P, 67, 86, 50 PL

[56] References Cited

U.S. PATENT DOCUMENTS

| | | | |
|---|---|---|---|
| 2,731,347 | 1/1956 | Gray | 96/114 |
| 3,240,604 | 3/1966 | Cook | 96/87 R |
| 3,443,946 | 5/1969 | Grabhofer | 96/67 |
| 3,458,311 | 7/1969 | Alles | 96/39.1 |
| 3,539,344 | 11/1970 | Russell | 96/67 |

*Primary Examiner*—Edward C. Kimlin

[57] ABSTRACT

Photopolymerizable elements are provided which comprise: (1) A support, (2) an addition polymerizable photosensitive layer, and (3) a solid, water-permeable, oxygen barrier protective layer, non-strippable as an unsupported film, said layer covering the entire photosensitive layer and being coated from an aqueous solution of a water-soluble macromolecular organic polymer or copolymer, e.g., polyvinyl alcohol, having dispersed therein, finely divided solid particles of a water-insoluble polymer or copolymer selected from acrylic and alkacrylic polymers or copolymers and mixtures thereof, and copolymers of vinyl pyrrolidone and vinyl acetate.

5 Claims, No Drawings

OXYGEN BARRIER LAYERS FOR PHOTOPOLYMERIZABLE ELEMENTS

CROSS-REFERENCE TO RELATES APPLICATION

This is a continuation-in-part of application Ser. No. 292,501, filed Sept. 27, 1972, now abandoned.

BACKGROUND OF THE INVENTION

1. Field of the Invention

This invention relates to photopolymerizable elements useful in the photomechanical arts, e.g., lithographic printing plates and printed circuits.

2. Description of the Prior Art

Alles, U.S. Pat. No. 3,458,311, July 29, 1969, discloses a homogeneous solid protective layer transparent to actinic radiation on a photopolymerizable stratum coated on a support. The protective stratum is nonstrippable as an unsupported film, substantially impermeable to oxygen, water-permeable and composed of a macromolecular polymer or polymer mixtures soluble in water or water mixed with a water-miscible organic solvent. The layer imparts enhanced speed and contrast to photopolymerizable strata because of oxygen impermeability. The layer is more easily applied and removable during the development washout of the exposed photopolymerizable stratum than the unitary cover sheets of the prior art. However, the protective layers of the Alles patent, when using the macromolecular polymers alone or in admixture, tend either to have poor adhesion for the photopolymerizable layer or under conditions of high humidity, become tacky and tend to be damaged by material in contact with its outer surface. The previously proposed protective layers tend to adhere to image films, i.e., photographic negatives, "goldenrod" paper and opaquing material conventionally used on the negatives when such materials are placed in contact with said layers during exposure in vacuum printing frames, particularly under conditions of high humidity. The adhesion usually causes the protective layer to pull away from the photopolymerizable layer when the image film is removed after exposure. Detachment of the protective layer before and during exposure is detrimental to the quality of the photopolymer layer, especially in the conventional step-and-repeat exposure machines used in making lithographic printing plates. The damage caused by the detachment of the protective layer manifests itself by lowering the photographic speed and causing poor image quality because of reciprocity failure under conditions of low intensity exposure and insufficient vacuum in the printing frame. The resulting printing plates exhibit poor wear qualities and also poor exposure and processing latitude.

Several U.S. patents are known wherein photosensitive materials have layers which contain solid particles. The solid particles are not present in a layer for the purpose of improving adhesion between the particle-containing layer and another layer of the photosensitive materials.

Russell, U.S. Pat. No. 3,539,344 relates to coatings of protective material which contain beads of synthetic resins, the coatings being present in the photosensitive material only at surface areas that are not intended for photographic recording. The polymer beads of Russell are for the purpose of providing mechanical separation between stacked film.

Grabhofer et al. U.S. Pat. No. 3,773,976 relates to a transparent roughened protective layer on a silver halide emulsion. The protective layer contains acrylonitrile particles to roughen the surface of a layer to enable it to be written on. There is no teaching that the protective layer prevents oxygen inhibition since the photosensitive layer is a silver halide emulsion layer and not a photopolymerizable layer.

Cook, U.S. Pat. No. 3,240,604 teaches adding polytetrafluoroethylene particles to a layer on a silver halide element to prevent blocking or adhering when the elements are stacked or packaged together. There is no teaching or need to preclude oxygen from inhibiting the light sensitive layer. The layer is designed to be water resistant, not water permeable.

Gray, U.S. Pat. No. 2,731,347 teaches the use of polytetrachloroethylene type polymers for delustering silver halide emulsion layers. It does not disclose acrylic or alkacrylic polymers in an oxygen impermeable protective stratum.

SUMMARY OF THE INVENTION

It has now been found that the difficulties encountered by the prior art protective layers can be overcome by this invention. The novel photopolymerizable elements of this invention comprise, in order, 1. a support which may embody antihalation material in or on its surface,
2. a solid photopolymerizable stratum containing
   a. at least nongaseous ethylenically unsaturated monomeric compound containing at least one terminal ethylenic group, and being capable of forming an insoluble polymer by photoinitiated addition polymerization,
   b. an addition polymerization initiating system activatable by actinic radiation, and
   c. an organic macromolecular polymer binder for and compatible with said unsaturated monomeric compound, and
3. an adherent, solid, protective stratum over the entire area of said photopolymerizable stratum transparent to actinic radiation, said protective stratum having a thickness of 0.2 to 25 microns and being characterized in that it is (i) nonstrippable as an unsupported film, (ii) substantially impermeable to oxygen, and (iii) water-permeable and composed of a macromolecular organic polymer or polymer mixture that is soluble in water or in a mixture of water and a water-miscible organic solvent, and said protective stratum having dispersed therein, solid particles of at least one water-insoluble vinyl polymer taken from the group consisting of water-insoluble acrylic and alkacrylic polymers and copolymers (including terpolymers) and water-insoluble vinyl pyrrolidone — vinyl acetate copolymers said particles being at least 0.05 micron in diameter and being present in amounts from 10 to 60 percent by weight of the total polymer in said protective stratum.

DETAILED DESCRIPTION OF THE INVENTION

Monomeric constitutent (a) and polymeric binder constituent (c) are preferably present in the photopolymerizable layer in amounts from 10 to 60 parts and 90 to 40 parts, by weight, respectively, and constituent (b) should be present in an amount of 0.5 to 10 parts by weight of constituent (a) the ethylenically unsaturated compound.

Useful macromolecular, water-soluble organic polymers having the characteristics given above include polyvinyl alcohol and its partial esters, ethers and acetals, or copolymers thereof that contain a substantial amount of unsubstituted vinyl alcohol units, so that they have the requisite solubility in water. Suitable such polymers include 88% to 100% hydrolyzed polyvinyl acetate, chloroacetate or propionate, polyvinyl formal and polyvinyl acetal and copolymers thereof. Other useful polymers include gelatin and gum arabic.

Useful water-insoluble polymers can be selected from a large group of known polymers, copolymers and terpolymers of the above classes including homopolymers and copolymers of alkyl acrylates, e.g., homopolymers and copolymers of ethyl acrylate and butyl acrylate, vinyl acetate-methyl methacrylate copolymer, poly-(ethyl acrylate), poly(methyl methacrylate-ethyl acrylatemethacrylic acid) terpolymer, and copolymers of vinyl pyrrolidone and vinyl acetate. In addition, mixtures of the above terpolymers and homopolymers and/or copolymers may be used, such as those disclosed in Assignee's Rawlins U.S. Pat. No. 3,567,452 and Cohen, U.S. Pat. No. 3,460,944. Further useful, polymer combinations can be derived from the sequential polymerization of a mixture of (a) vinylidene chloride/alkyl-/acrylate/itaconic acid copolymer wherein the alkyl group contains 1–4 carbon atoms and said components are present in the respective amounts by weight 35 to 96%, 3.5 to 64.5% and 0.5 to 25% and (b) a polymer, i.e., homopolymer or copolymer, of an acrylate ester selected from the group consisting of (i) alkyl acrylates wherein the alkyl group contains 1–10 carbon atoms, and (ii) alkyl methacrylates wherein the alkyl group contains 1–10 carbon atoms, polymerized in an aqueous dispersion of terpolymer (a), the terpolymer (a) and polymer (b) in the respective amounts by weight of 90 to 60% and 10 to 40%. The method of carrying out the sequential polymerization of the above components is described in Assignee's Rawlins, U.S. Pat. No. 3,443,950.

The above-described polymers and mixtures thereof may be added as hydrosols to aqueous solutions the macromolecular polymers described under (3) above in amounts from 10% to 60% based on the total polymer in the composition which may be coated on any photosensitive surface to accomplish the objectives stated above. The particle size of the dispersed polymer may range from 0.05 to 5.0 microns or more in diameter. The aqueous dispersions may and preferably do contain a small amount of a finely divided, inorganic filler, e.g., colloidal silica.

The aqueous dispersions are coated and dried in a conventional manner, infra-red lamps being a convenient source of heat for drying.

Suitable photopolymerizable layers and supports include those disclosed in Alles, U.S. Pat. No. 3,458,311, Heiart, U.S. Pat. No. 3,060,026, and Chang and Fan U.S. Pat. No. 3,549,367. Preferred supports are thin and flexible, and have a hydrophilic surface, e.g., grained aluminum sheets, steel plates and copper clad epoxy-fiber glass boards. The photopolymerizable layers may contain dyes, pigments, fillers, thermal polymerization inhibitors, plasticizers, and other ingredients, including the specific ingredients of these types that are described in Burg, U.S. Pat. No. 3,203,805 and the Alles, and Heiart patents listed above, and chain transfer agents as described in Barney et al., U.S. Pat. No. 3,046,127.

Useful specific polymer binders for the monomer initiating system in the photopolymerizable layer include those listed in the four just-mentioned patents and those described later in this application which contain acid or water-soluble salt groups, e.g., carboxyl and sulfonic groups, e.g., carboxyl and sulfonic groups and their sodium, potassium, ammonium, substituted ammonium or amine salts. There must be insufficient acid groups to make the polymer soluble in a dilute sodium hydroxide solution alone, but it should be soluble in a mixture of an organic solvent, water, and sufficient alkali to convert the majority of the acid groups to water soluble salt groups. A combination of certain especially preferred binder materials and an ethylenically unsaturated compound that is preferably water insoluble for the formation of lithographic printing plates are those disclosed in the above mentioned Alles patent.

Systems comprising photopolymerizable layers which are coated on copper-clad, epoxy fiber glass boards, the polymeric binders of which are only soluble in organic solvents and do not contain the above-described solubilizing groups may also utilize the protective strata of this invention. In addition, the transfer process described in the above Heiart patent may also use the protective strata of this invention in place of the unitary, strippable, cover sheet of that patent. The elements used in the process described in Celeste, U.S. Pat. No. 3,469,982 may also utilize the novel protective layers of this invention. After exposure, the protective stratum is removed by immersion in water or in a mixture of water and a water miscible organic solvent containing at least 50% by volume of water.

The protective stratum is applied from an aqueous dispersion of the water-soluble macromolecular organic polymer and dispersed, water insoluble polymers and copolymers. The resulting layer, after it is dried, has adequate adhesion to the photopolymerizable layer and is so thin that it cannot be stripped mechanically, unsupported, as a unitary layer from the surface of the photopolymerizable layer. If a surfactant having wetting properties is present in the coating composition, a more uniform layer results. The layer is very thin, being from 0.2 to 25 microns in thickness, and preferably is removable in the conventional developer solutions used to form a printing relief after imagewise exposure of the photopolymerizable layer. The latter layer is removable imagewise whereas the protective layer is removable over the entire area of the element treated. Because the useful water-insoluble vinyl polymers are negatively charged, an anionic or nonionic surfactant should be used in the system. Cationic surfactants should ordinarily be avoided, because they tend to cause the polymers to flocculate or coagulate. Useful surfactants include sodium alkyl sulfates and sulfonates of 12–18 carbon atoms, e.g., sodium dodecylsulfate and sodium octadecylsulfonate; polyethylene glycols of average molecular weight below 400 and derivatives, e.g., isooctylphenyl polyethyoxyethanol (9–10 ethoxy groups, etc.).

In the preparation of printing plates as described in the above Alles patent where the protective layers of this invention are especially useful, the developer solution can be used as a bath or in the form of a spray. Removal of the unexposed areas of the photopolymerizable layer can be improved by brushing, by the application of a wet sponge and rubbing, and by other known procedures. Such treatments aid in the removal of the protective layers from the relief images.

The solvent media used to develop the exposed plates are aqueous media, i.e., water is the major constitutent. The developers also contain a water-miscible organic solvent and an alkaline material. Suitable organic solvents include isopropanol, butanol, diacetone, alcohol, 1-methoxyethanol, 2-ethoxyethanol, 2-n-butoxyethanol, ethyl carbitol and butyl carbitol. Suitable alkaline materials include metal hydroxides, sodium metasilicate, triethanolamine, morpholine, trisodium phosphate, sodium carbonate, sodium borate, etc. The developer may also contain a surface active wetting agent. Other ingredients of the developer include dyes, salts to control swelling, salts to etch the metal base, etc. Other suitable developing solutions are those disclosed in Alles, U.S. Pat. No. 3,475,171 and Lam. U.S. Pat. Nos. 3,615,480 and 3,627,685.

The support, in the case of preparing lithographic plates according to the above mentioned Alles patent, preferably has a hydrophilic surface at the time the photopolymerizable layer is applied. Thus, when the plate is exposed and developed to remove the photopolymerizable layer in the unexposed areas, the areas of the support which are uncovered will be desensitized, i.e., they will repel a greasy or lipophilic ink while being receptive to water and aqueous solutions.

Preferably, the support is thin and flexible, ranging from about 0.005 to 0.03 inch in thickness.

Aluminum is commercially available in a wide variety of thicknesses. The aluminum may be untreated (except for a thin layer of oxide which forms immediately at its surface when exposed to air) or may have been provided with surface treatments or coatings to leave a hydrophilic surface e.g. anodized aluminum for lithographic printing plates. The surface can be, and preferably is roughened (mechanically, chemically, or electrochemically) to improve retention of aqueous liquids and to improve adhesion to strata to be applied thereon. Other metals suitable for supports include bimetal supports such copper clad aluminum, tin-plated, steel aluminum clad steel, nonplated steel, galvanized carbon steel, and zinc; plastic films, e.g., the polyethylene terehthalate films and copolymer coated films disclosed in Alles, U.S. Pat. No. 2,779,684, and paper and cardboard treated in a manner to impart a hydrophilic surface. Also other surfaces which are not hydrophilic may be used such as copper clad epoxy fiber-glass boards for the preparation of printed circuits and other photomechanical uses.

By substituting for the water-insoluble vinyl polymers and copolymers of the following examples, similar amounts of other water-insoluble polymers and copolymers that have been described above, similar beneficial results can be obtained.

Results similar to those obtained in the following examples can also be obtained by substituting for the photopolymerizable compositions of the Examples, other specific organic polymers containing acid groups, including the copolymers disclosed in Example IX of Alles, U.S. Pat. No. 3,458,311 and the addition copolymers described in Barney, U.S. Pat. No. 2,893,868, patented July 7, 1959. The polymers of this latter patent contain, for example, lateral free acid groups, such as sulfonic, carboxylic and phosphoric acid groups. When these polymers, before esterification, can be neutralized with a base, for example, with an alkali metal hydroxide, e.g., sodium or potassium hydroxide, or a corresponding carbonate or ammonia or substituted ammonium base, e.g., tetramethylammonium hydroxide and tetraethylammonium hydroxide or an organic amine, e.g., ethanolamine, ethylenediamine, diethylenetriamine, 2-amino-2-hydroxy-2-methyl-1,3-propandiol-1,3-diaminopropanol-2 and morpholine, the free acid groups are converted to salt groups and the resulting layers have the advantage that they can be removed in aqueous solvents free from alkali.

Preferred photopolymerizable monomers that can be present in the photosensitive layer include substantially water-insoluble materials containing two or more terminal ethylenic groups which are disclosed in Plambeck, U.S. Pat. No. 2,760,863 and Burg et al., U.S. Pat. No. 3,060,023. Monomers with only a single terminal ethylenic group can be employed, but the composition will be considerably less sensitive to actinic radiation. When chain transfer agents are present in the photopolymerizable layer, especially polyolefin oxides, as listed in U.S. Pat. No. 3,046,127, glycerol, triethylene glycol diacetate, and triethylene glycol dicaprate and dicaprylate mixed ester, higher speeds are obtained. The chain transfer agent, if present, can be used in amounts up to 50% based on the amount of ethylenically unsaturated monomer.

Useful addition polymerization initiators activatable by actinic radiation and thermally inactive below 85° C consist of substituted and unsubstituted polynuclear quinones. Specific useful quinones of this type that can be used in the photosensitive layers of this invention are listed in Notley, U.S. Pat. No. 2,951,758 patented Sept. 6, 1960. Other lophine dimers (bis-2,4,5-triphenyl imidazoles) in addition to those disclosed in Example I, X and XI of Notley can also be used, such as those disclosed in British Patent No. 997,396 published July 7, 1965 and 1,047,569 published Nov. 9, 1966. Suitable free radical producing hydrogen doner agents for use in such systems, e.g., organic amines, mercaptans, triphenylmethane dyes are set forth in the above British Specifications. Suitable color amine-substituted leuco dyes which function both as a colorforming agent and a free radical generating agent can be used in the photosensitive layers of this invention. Especially useful leuco dyes have at least one dialkylamino group. Also any amine substituted leuco triphenylmethane dye or various salts of the dye can be used. Leuco forms of crystal violet which are oxidized upon exposure to form visible images are preferred. Other suitable leuco dyes or their salts are disclosed in Chang and Fan, U.S. Pat. No. 3,549,367 patented Dec. 22, 1970. Thermal addition polymerization inhibitors, as described in this patent, can be present in the photopolyermizable layers in amounts set forth in the patent.

Printing plates made from the elements of this invention has unusually long press life. The thin protective coatings containing dispersed finely divided solid particles of at least one water-insoluble copolymer of vinyl acetate and vinyl pyrrolidone, or water-insoluble acrylic and alkacrylic polymers and copolymers (including terpolymers) have many advantages over the thin protective layers and strippable protective films of the prior art. They are extremely insensitive to humidity and temperature changes resulting in layers having good adhesion to the underlying photosensitive layer and low surface tackiness which eliminates damage by "goldenrod" masking papers and opaqued negatives placed in surface contact with the elements, particularly during exposure in vacuum printing frames. The layers are equally as oxygen impermeable layers as those disclosed in Alles, U.S. Pat. No. 3,458,311 which do not contain water-insoluble dispersed particles.

As will be evident from the examples, the novel overcoating compositions are useful not only in preparing printing plates as disclosed in the above Alles patent but may also be used to advantage in preparing printed circuits and in other photomechanical uses where higher photospeed and resolution are needed.

While the photosensitive stratum of the invention is described as photopolymerizable, elements which photoharden by related mechanisms such as photocrosslinking and photodimerization are included in the scope of the invention.

The invention will now be further illustrated in and by the following examples, wherein the amounts and percentages in the compositions are all by weight unless otherwise indicated.

EXAMPLE I

A photopolymerizable composition was prepared from the following ingredients:

| | |
|---|---|
| Poly(methyl methacrylate/methacrylic acid) (90/10) | 300.0 grams |
| Trimethylolpropane triacrylate | 114.0 grams |
| 2-(O-chlorophenyl)4,5-bis(m-methoxyphenyl) imidazolyl dimer | 11.2 grams |
| Tris-(p-dimethylamino-o-tolyl)methane | 9.0 grams |
| 4,4'-bis(p-dimethylamino)benzophenone | 6.0 grams |
| Solvent Red C.I. #109 | 6.0 grams |
| Mixture of decanoic and octanoic acid ester of triethylene glycol | 36.0 grams |
| 4,4',4"-methylidynetris(N,N-dimethylaniline) | 2.0 grams |
| 2-ethoxyethanol to bring total weight to | 1500.0 grams |

The above ingredients were thoroughly mixed by mechanical stirring and coated on aluminum supports and dried as described in Alles, U.S. Pat. No. 3,458,311 to give a dry coating weight of about 50 mg/dm². After drying, one plate was overcoated with a 3% aqueous solution of polyvinyl alcohol (medium viscosity 88% hydrolyzed polyvinyl acetate) containing 2% based on the weight of total solids iso-octyl/phenoxypolyethoxy/ethanol (9–10 ethoxy groups) to give a coating weight of 5 mg/dm² and another plate was coated with a 4% aqueous solution of polyvinyl alcohol (medium viscosity, 88% hydroylzed polyvinyl acetate) and polyvinyl pyrrolidone in a ratio of 90/60 containing 2% of iso-octyl/phenoxypolyethoxy/ethanol (9–10 ethoxy groups) to give a coating weight of about 9.6 mg/dm². These photosensitive elements were used as controls in the tests described blow. A third plate, having the above photosensitive layer coated thereon, was overcoated with a composition comprising a 3% aqueous solution of medium viscosity polyvinyl alcohol (99–100% hydrolyzed polyvinyl acetate) having dispersed therein a terpolymer of poly(methyl methacrylate-ethyl acrylatemethacrylic acid) (66/29/5), said terpolymer being added as an aqueous dispersion containing 10% by weight of terpolymer of ethylene glycol monoethyl ether, to give a ratio of 30 parts of the water-insoluble terpolymer and 70 parts of polyvinylalcohol on a dry weight basis. A small amount, (approximately 1%) of the above iso-octyl/phenoxypolyethoxy/ethanol (9–10 ethoxy groups) surfactant was also added. The composition was thoroughly mixed and coated over the photosensitive layer to give a dry coating weight of 5.8 mg/dm². The overcoated plates were dried by means of infrared lamps to remove about 98% of the water. The plate temperature should not exceed 230° F.

To test the adhesion of the overcoating to the photosensitive layer, the following procedure was carried out.

Sheets of the controls and sample of the photosensitive elements were scribed in 36 blocks of ½ inch squares in a 3 × 12 inch area and a Scotch® Lithographic Tape No. 616 adhesive tape was adhered to the area, being careful to make a smooth application to insure good contact between tape and sample. The tape is then immediately pulled off quickly, pulling parallel to the plate. The total of squares of overcoating left on the plate is taken as a percentage of the total number of squares scribed on the plate. The higher the percentage, the greater the adhesion the overcoating will have to the photosensitive layer.

Upon pulling off the tape from the control containing only polyvinyl alcohol, all of the squares of the overcoating came off thus indicating poor adhesion and minimal protection against oxygen inhibition during exposure in areas where the overcoat was pulled off by the tape. The control containing polyvinyl alcohol and polyvinyl pyrrolidone showed about 39% squares left showing some improvement in adhesion. The sample showed 86% of the scribed squares of the overcoating left after removal of the tape thus indicating a substantial improvement in adhesion with the sample containing the terpolymer.

To further test the efficacy of the addition of the water-insoluble terpolymer to the aqueous polyvinyl alcohol solution, the following procedure was carried out to determine the tackiness of the layers under conditions of high humidity.

A sandwich arrangement was made by placing pieces of "goldenrod" paper (used in the preparing exposure flats for lithographic platemaking) along with pieces of film carrying various opaquing materials painted thereon, between and in contact with the overcoating layers of two panels of each of the controls and the sample plates. The sandwich arrangement was allowed to equilibrate at 80–90% relative humidity at 90°–100° F for 16–24 hours. The paper, film emulsion layer and opaqued areas absorb moisture and develop a certain amount of tackiness. The conditioned sandwich was then carefully placed in a moistureproof polyethylene bag, sealed, and quickly transferred to a vacuum frame and given a simulated exposure. Pressure on the vacuum frame and heat from the exposure source cause the plates to come into intimate contact with the paper and film between them. Exposure was prolonged over that necessary for image exposure in order to exaggerate the effects of heat and pressure. It was found that both controls showed some sticking of the opaquing materials to the overcoating layer and that there was severe sticking of the paper to the overcoating layer comprising polyvinyl alcohol and polyvinyl pyrrolidone. In such cases, it was virtually impossible to remove the paper fibers without damage to the layer. The overcoating of the sample having the water-insoluble terpolymer dispersed therein showed no tendency for the paper to stick to the overcoating layer and very little tendency for the opaquing material to adhere to said layer. This test showed that the novel compositions of this invention provides substantial improvement in overcoming the problems attendant with tackiness.

All plates were exposed for 42 seconds in a vacuum printing frame under a high contrast negative by a 140-ampere carbon arc at 56 inches.

The images were developed by washing out the unexposed areas of the plates with a solution having the following composition:

| | |
|---|---|
| Water | 750 ml |
| Sodium silicate ($SiO_2$:$Na_2O$ 3.85/1.0) | 78 gm |
| 2-n-Butoxy ethanol | 60 ml |
| Iso-octyl phenoxy ethoxy ethanol | |
| (9-10 ethoxy groups) | 2 ml |
| Water to make | 1 liter |

After developing and rinsing, the plates were finished by gumming in a conventional manner and reproductions were made using a wet offset printing press using the usual black lipophilic ink and fountain solution. The overcoat of all plates washed off during development not only in the unexposed areas, but also from the exposed areas leaving image areas having a high receptivity for the ink. The sample plate showed no loss in photographic speed as compared to the controls thus indicating good oxygen impermeability of the sample layer.

EXAMPLE II

Example I was repeated using the same controls except that the sample overcoating comprised a 5% aqueous solution of a copolymer of 2 mole percent methyl methacrylate and 98 mole percent vinyl acetate which had been 99–100% hydrolyzed said aqueous solution having dispersed therein poly(methyl methacrylate/ethyl acrylate/methacrylic acid) (50/45/5) containing 10% by weight of the terpolymer of diethylene glycol monoethyl ether. The aqueous dispersion contained 30 parts of terpolymer and 70 parts of the polyvinyl alcohol copolymers on a dry weight basis. There was also added about 1% by weight of the perfluoro carbon compound surfactant based on total solids having

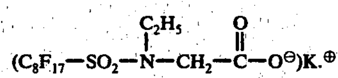

It was coated over the photosensitive layer in an amount to give 16.5 mg/dm². The tape test indicated a 94% retention of the scribed blocks adhering to the photosensitive layer. The tackiness test gave results comparable to those in Example I. The photographic speed was comparable with the controls of Example I.

EXAMPLE III

Example I was repeated using a 7% low viscosity polyvinyl alcohol (99% hydrolyzed polyvinyl acetate) having dispersed therein the terpolymer of Example II but using, based on the weight of the terpolymer 10% of ethylene glycol monoethyl ether. The final composition also contained about 0.45% based on the weight of total solids of the fluorinated hydrocarbon surfactant disclosed in Example II. The composition was coated over the photosensitive layer to give a dry coating weight of 13.6 mg/dm². The tape tests, tackiness tests and speeds were the same as Example II thus showing a substantial improvement over the controls.

EXAMPLE IV

Example I was repeated using the controls described in that Example and a third plate having the photosensitive layer coated thereon, was overcoated with a 5% aqueous solution of a copolymer of 2 mole percent methyl methacrylate and 98% mole percent of vinyl acetate which had been 99–100% hydrolyzed. Said aqueous solution had dispersed therein, a sequentially polymerized poly(vinylidene) chloride/methyl methacrylate/itaconic acid) (90/10/2) co ethyl acrylate (75/25) prepared in the manner described in Procedure A of Rawlins, U.S. Pat. No. 3,443,950. The aqueous composition also contained 1% by weight based on the dispersed polymeric composition of iso-octyl phenoxy ethoxy ethanol (9–10 ethoxy groups) surfactant and the ratio of the polyvinyl alcohol copolymer to the dispersed polymer was about 70:30. The resulting composition was coated to give a dry coating weight of approximately 9.8 mg/dm². Adhesive tape tests indicated that 78% of the scribed squares adhered to the photosensitive layer. The results of the tackiness test were comparable to those of Example I. The photographic speed was comparable to samples above.

EXAMPLE V

Example IV was repeated using as the dispersed polymer, polyethyl acrylate which had been polymerized in an aqueous medium containing a small amount of sodium salt of lauryl sulfate as a surfactant. The ratio of polyvinyl alcohol copolymer to the polyethyl acrylate was 70:30. The aqueous dispersion also contained about 1% based on the weight of the polyethyl acrylate of the surfactant, iso-octyl phenoxy ethoxy ethanol (9–10 ethoxy groups). The resulting composition was coated over the photosensitive layer of the coated plates described in Example I to give a dry coating weight of approximately 9.9 mg/dm². Adhesive tape tests indicate 80% retention of the scribed squares, and tackiness tests and photographic speeds were comparable to those in the above Examples.

EXAMPLE VI

The photopolymerizable composition of Example I was coated on an aluminum plate as described therein.

Over the photosensitive layer there was coated an aqueous dispersion having the following composition:

| | |
|---|---|
| A. 16% aqueous solution of low viscosity polyvinyl alcohol (99% hydrolyzed polyvinyl acetate) | 1.0 Kg. |
| B. (1) Co(vinyl pyrrolidone/vinyl acetate) (60:40) (M.W. 40,000-120,000) | 48.4 g. |
| (2) Distilled water | 194.0 g. |
| (3) Iso-octyl phenoxypolyethoxy ethanol (9-10 ethoxy groups) (10% solution) | 45.0 g. |
| (4) Ethanol | 86.4 g. |
| (5) Ethyl cellosolve | 100.0 g. |

Solution 'B' was thoroughly agitated and then added to solution 'A' with mechanical stirring to form the aqueous overcoating composition.

Two plates were coated as controls as described in Example I and a third plate was coated with the above aqueous dispersion was coated with a top roll coating apparatus which is well known in the coating art. The coating was dried using infrared radiation. The dry coating weight was 16.3 mg/dm².

The tape test carried out as described above showed that 100 % of the scribed squares remained on the photopolymerizable layer which indicates that the problem of poor adhesion of the oxygen barrier overcoating has been eliminated. Tackiness tests indicated that sensitivity to high humidity has been substantially reduced. Photographic speed was as good if not better than the controls.

EXAMPLE VII

A grained aluminum plate was coated with the following composition:

| | |
|---|---|
| Poly(methyl methacrylate/methacrylic acid) (90/10) | 300.0 grams |
| 2-(o-chlorophenyl)-4,5-bis(m-methoxyphenyl) imidazolyl dimer | 8.4 grams |
| 2-(o-chlorophenyl)-4,5-diphenyl-imidazolyl dimer | |
| Tris-(4-diethylamino-o-tolyl)methane | 9.0 grams |
| 4,4'-bis(p-dimethylamino)benzophenone | 6.0 grams |
| Solvent Red C.I. 109 | 6.0 grams |
| Mixed ester of triethylene glycol dicaprate and dicaprylate | 36.0 grams |
| 4,4,',4"-methylidynetris(N,N-dimethylaniline) | 2.0 grams |
| Trimethylolpropane triacrylate | 114.0 grams |
| 2-ethoxyethanol to bring total weight to | 1450.0 grams |

The above ingredients were thoroughly mixed by mechanical stirring and coated and dried as designed in Example I to give a dry coating weight of 50 mg/dm$^2$.

One sheet was overcoated with a 3% aqueous solution of polyvinyl alcohol as described in Example I above and was used as a control. A second sheet was coated with an aqueous dispersion of the following ingredients:

| | |
|---|---|
| Polyvinyl alcohol (low viscosity) (99% hydrolyzed polyvinyl acetate) (16% aqueous) solution | 160.0 grams |
| Dimethyl formamide | 8.0 grams |
| 30% solids in aqueous dispersion of poly(methyl methacrylate/ethyl acrylate/methacrylic acid)(50/45/5) | 15.0 grams |
| 10% aqueous solution iso-octyl phenoxy ethoxy ethanol (9-10 ethoxy groups) | 0.6 grams |
| 10% aqueous solution of perfluorocarbon compound surfactant shown in Example II | 1.52 grams |

After throughly mixing, the aqueous dispersion had a viscosity of 276 centipoises as measured with a Brookfield Viscosimeter using a #2 spindle at 60 RPM.

The dry coating weight was 14.2 mg/dm$^2$. Adhesive tape tests carried out as described in Example I showed that 95% of the scribed blocks were left on the photosensitive layer after pulling off the tape, while all of the blocks of the control were pulled off from the photosensitive layer by the tape.

EXAMPLE VIII

The photopolymerizable composition of Example I was coated on an aluminum support as described therein. Control plates were overcoated as described in that Example. Plates III and IV were coated with a 16% aqueous solutions of low viscosity polyvinyl alcohol (99% hydrolyzed polyvinyl acetate) containing the copolymer prepared and added along with an inorganic colloidal silica dispersion to the polyvinyl alcohol solution which is designated 'A', the copolymer being designated 'B' and the colloidal silica being designated 'C'

The copolymer 'B ' contained the following:

-continued

| | |
|---|---|
| (1) Co(vinyl pyrrolidone/vinyl acetate)(60:40) (M.W. 40,000-120,000) | 54.2 g. |
| (2) Distilled water | 218.0 g. |
| (3) Iso-octyl phenoxypolyethoxy ethanol (9-10 ethoxy groups) (10% sol.) | 45.0 g. |
| (4) Ethanol | 60.0 g. |
| (5) Ethyl cellosolve | 71.0 g |

The above ingredients were thoroughly agitated and added to 1250 grams of solution 'A' while stirring. After this addition there was added 55.6 grams of a 30% aqueous dispersion of an alumina modified, sodium stabilized colloidal silica having a viscosity of 220 centipoises using a Brookfield Viscosimeter with a #2 spindle at 60 RPM. This composition was coated on plate III. To a similar polyvinyl alcohol — copolymer dispersion there was added 55.6 grams of a 30% aqueous dispersion of an ammonia stabilized colloidal silica having a viscosity of 230 centipoises using a Brookfield Viscosimeter with a #2 spindle at 60 RPM. This composition was coated on plate IV. The plates were coated with the above compositions to give a dry coating weight of 13 mg/dm$^2$.

Adhesion tape tests showed that 100% of the squares remained on plate III and 89.0% of the squares remained on plate IV as compared to control plate I coated with polyvinyl alcohol along where all of the squares came off with the tape and in plate II coated with polyvinyl alcohol and polyvinyl pyrrolidone (90/60) 30% of the squares remains. The tackiness test results showed greatly reduced sensitivity to high humidity. Photographic speed of both sample plates (III and IV) was excellent, indicating that the novel layers were very efficient in preventing oxygen inhibition of free radical polymerization in photopolymerizable layers.

EXAMPLE IX

An aluminum plate was coated with the photopolymerizable composition described in Example I. Control plates were overcoated as described in that Example. Plate III was coated with the following composition:

| | |
|---|---|
| 16% aqueous solution of polyvinyl alcohol of Example VIII | 1250.0 grams |
| Co(vinyl pyrrolidone/vinyl acetate)(60:40) (M.W. 40,000-120,000) | 54.2 grams |
| Distilled water | 218.0 grams |
| Iso-octyl phenoxyethoxy ethanol (9-10 ethoxy groups) (10% solution) | 50.2 grams |
| Ethanol | 60.0 grams |
| Ethyl cellosolve | 71.0 grams |
| Co(methyl methacrylate/ethyl acrylate/methacrylic acid) (30% solids) (50/45/5) | 74.0 grams |

Viscosity using a Brookfield Viscosimeter with a #2spindle was 220 centipoises at 60 RPM. The coating weight was 13 mg/dm$^2$.

Adhesive tape tests resulted in 100% retention of the scribed squares to the photosensitive layer. Tackiness tests showed that damage due to high humidity had substantially eliminated. Photographic speeds were equal to or better than to the control plates.

EXAMPLE X

A photopolymerizable element suitale for preparing printed circuits and similar electronic components was prepared in the following manner.

A polyethylene terephthalate film having a thickness of approximately 0.001 inch was coated with a composition comprising the following ingredients:

| | |
|---|---|
| 99-100% hydrolyzed co(vinyl acetate/methyl methacrylate (98/2) (8.5% aqueous soln.) | 1060.0 grams |
| Ethylene glycol monoethyl ether | 38.0 grams |
| Poly(methyl methacrylate/ethyl acrylate/methacrylic acid) (50/45/5) 30% solids in aqueous dispersion | 127.5 grams |
| 10% aqueous solution of the perfluorocarbon compound surfactant disclosed in Example II | 12.5 grams |

The dispersion was coated with a doctor knife and dried to give a dry coating weight of about 22 mg/dm². Over this layer there was coated a photopolymerizable composition of the following formulation:

| | |
|---|---|
| Poly(methyl methacrylate/methacrylic acid) (90/10) | 50.4 grams |
| Polymethyl methacrylate (M.W. 60,000) | 5.0 grams |
| Trimethylolpropane triacrylate | 35.0 grams |
| Tricresyl phosphate | 5.0 grams |
| 4,4'-bis(dimethylamino)benzophenone | 4.0 grams |
| 4,4',4''-methylidynetris(N,N-dimethyl-aniline) | 0.1 grams |
| Solvent Red C.I. #109 | 0.1 grams |

The above ingredients were thoroughly mixed by mechanical stirring, coated and dried to give a layer thickness of 0.0018 inch. Over this coating there was laminated at a temperature of 60° C a sheet of polypropylene film having a thickness of 0.001 inch.

A piece of copper clad, epoxy-fiber glass board was cleansed by scouring with an abrasive cleaner, swabbing and thoroughly rinsing in water. It was then given a 20 second dip in a dilute hydrochloric acid solution (2 volumes water +1 volume conc. hydrochloric acid), a second rinse with water and then dried with air jets.

A polypropylene film was removed from the laminated element and the surface of the photosensitive layer was laminated to the copper board at a temperature of about 121° C. in the manner described in Example I of Assignee's, Celeste, U.S. Pat. No. 3,469,982. The support film was then stripped off leaving the photosensitive layer covered with the layer coated with the polyvinyl alcohol aqueous dispersion described above. This shows that the layers coated from the aqueous dispersions of this invention have good adhesion for the photopolymerizable layers.

As a control, a photosensitive element was prepared using the above photosensitive polymerizable composition in the manner disclosed in Assignee's, Celeste, U.S. Pat. No. 3,469,982, where, after lamination to the copper clad epoxy fiber glass board, exposure was made through the original support which served as the oxygen barrier layer in place of the novel compositions of this invention. Both the control and the copper clad epoxy fiber glass board comprising the photosensitive layer containing only the coating of the polyvinyl alcohol aqueous dispersion were exposed to a high contrast, transparency image of a printed circuit in a printing frame as described in the Celeste Patent. The original support of the control was stripped off and both elements were developed for 100 seconds at 30° C to remove the unexposed photosensitive layer and all of the polyvinyl alcohol overcoating in a developer solution comprising 10% by weight of ethylene glycol monobutyl ether, 1% by weight of sodium tetraborate decahydrate and 89% by weight of water. After development, a precise, colored, resist image of the printed circuit remained on the copper clad epoxy fiber glass board. The boards were then etched with 45° Baume ferric chloride solution to remove the copper not covered by the resist image as described in the Celeste patent. The resist image was then removed by soaking the board in methylene chloride and swabbing to give high quality printed circuit boards. The advantage of using the overcoating is that it is not necessary to use an oxygen impermeable film as a support, i.e., a less expensive film no longer limited by thickness may be used. In addition, sharper printed circuit images can be obtained because the overcoating layer is thinner than the film support of the control. The photographic speed of the system is also improved.

EXAMPLE XI

Sheets of the photopolymerizable element used as a control in Example X were prepared and after removal of the cover sheets, the photosensitive surfaces were laminated to copper-clad epoxy fiber glass boards. The original 0.001 inch polyethylene terephthalate support films of two boards were removed by stripping and the exposed photosensitive surfaces were coated with the polyvinyl alcohol aqueous dispersion disclosed in Example X to give a dry coating weight of 7.0 mg/dm². Two of the photosensitive copper boards one with the film support and one with the polyvinyl alcohol overcoating layer were exposed through a $\sqrt{2}$ neutral density step wedge in a vacuum frame by means of a Scanex Model 26A exposing device manufactured by Colight, Inc. of Minneapolis, Minn. It uses a 1900 watt mercury vapor lamp as the radiation source. The boards were exposed at a travelling time of 65 seconds. The control board using the original film support as the oxygen barrier layer showed 5 steps of the wedge and the board containing the polyvinyl alcohol aqueous dispersion as the oxygen barrier protective layer showed an image of 6 steps when developed for 100 seconds at 30° C in the developer described in Example X. Two other boards were exposed in the above exposing device through a transparent No. 1-T Resolution Guide manufactured by a Stouffer Graphic Arts Equipment Co. This guide is used to measure resolution and halftone dots in the Graphic Arts industry. Results were as follows:

| Resolution | | Corresponds to: |
|---|---|---|
| Control | Negative #2.5 | 2.8 mil line |
| | Positive #2.0 | 2.8 mil line |
| Polyvinyl Alcohol Aqueous Dispersion Overcoating | Negative #1.75 | 2.2 mil line |
| | Positive #1.0 | 1.3 mil line |
| Halftone dot using a 150 line/in² screen | | |
| Control | Highlight #4 | 2.4 mil diameter |
| | Shadow #3 | 2.0 mil diameter dot |
| Polyvinyl Alcohol Aqueous Dispersion Overcoating | Highlight #3 | 2.0 mil diameter dot |
| | Shadow #1 | 1.1 mil diameter dot |

It is evident from the above data that the use of a thin overcoating coated from the polyvinyl alcohol aqueous dispersions of this invention provide superior qualities in terms of increased photographic speed and resolution of lines and halftone dots as compared to similar elements using strippable films having a much greater thickness than the nonstrippable overcoating layers.

EXAMPLE XII

The following two solutions were prepared:

| Solution A (for use in Preparing a UV Absorbing Layer) | |
|---|---|
| 2000 gm | 15 % acrylic hydrosol in water, which is a terpolymer made from 55% methyl methacrylate, 40% ethyl acrylate and 5% acrylic acid, 30% solids by weight with a particle size of 0.01-0.05 microns. |
| 50 gm | 10% solution of sodium lauryl sulfate in water |
| 30 gm | 10% water solution of the perfluorcarbon compound of Example II |

This slurry was heated to 350° C. and the mixture shown below was added slowly:

| | |
|---|---|
| 40 gm | Latyl Yellow 3G, Colour Index No. 54 |
| 35 gm | Luxol® Fast Orange GS, Colour Index No. 24 |
| 20 gm | 2,2'-dihydroxy-4-methoxybenzophenone |
| Solution B (for use in Preparing the Photoresist Layer) | |
| 600 gm | copolymer of methylmethacrylate (90 mole %) and methacrylic acid (10 mole %) |
| 24 gm | O-chlorophenyl-4,5-bis(m-methoxyphenyl) imidazole dimer. |
| 12 gm | 4,4'-bis(dimethylamino)benzophenone |
| 72 gm | mixed ester of triethyleneglycol-dicaproate and -dicaprylate |
| 300 gm | trimethylolpropanetriacrylate |
| 200 gm | 2-(2-ethoxy)ethanol |
| 4292 gm | trichloroethylene |
| Viscosity = 16 cps at 25° C using a #1 spindle in the Brookfield Viscometer | |

Solution A was machine coated on 0.007 inch thick polyethylene terephthalate clear film prepared as described in Example IV of assignee's Alles U.S. Pat. No. 2,779,684, containing a resin sub layer on one side only. Solution A was coated on the resin subbed side using an air knife as known to those skilled in the art. After heating and drying Solution B was coated on top of A in the same manner and the resulting product laminated with a 0.00075 inch thick, clear, biaxially oriented and heat-set polyethylene terephthalate film to yield a composite element having the structure where, from the top, (1) is biaxially-oriented and heat-set polyethylene terephthalate, (2) is photopolymerizable layer (from Solution B) about 0.0001-inch in dry thickness, (3) is the UV-absorbing layer (from Solution A), approximately 0.0001-inch dried thickness and (4) is resin subbed polyethylene terephthalate film support. The 0.00075 inch thick clear biaxially oriented and heat set polyethylene terephthalate film was stripped off from one of the two film elements and the photosensitive layer was coated with the aqueous dispersion described in Example VI above to give a coating weight of 7 mg/dm$^2$. The control sheet containing the 0.00075 inch cover film and the sheet containing the overcoating of the aqueous dispersion were given a 2-minute exposure through a $\sqrt{2}$ step wedge by means of a nuArc "Flip Top" Plate Maker, Model FT26M-2 using a carbon arc as a source of exposing radiation at a distance of 18 inches. The exposed sheets were developed in a developer of the following composition:

60 ml 2-(2-butoxy)ethanol 2 ml iso-octyl phenoxy ethoxy ethanol (9-10 ethoxy groups)

66.5 gms sodium silicate solution (60% solids in water)

Water to make 1 liter.

This solution not only developed the photoresist image, by washing out the unexposed photopolymer, but also dissolved the polymeric UV-absorbing layer in the identical area under the image and the overcoating over the exposed and hardened photopolymer thus producing an orange-yellow colored, exact positive copy of the original which was useful for preparing other copies.

The film element containing the cover sheet film gave an image of 5 steps and the sheet containing the aqueous dispersion overcoating gave an image of 6 steps which indicates a substantial increase in speed (40%).

Similar sheets were exposed through a transparent No. 1-T Resolution Guide manufactured and sold by the Stouffer Graphic Arts Equipment Co. The control element exposed through the cover sheet gave poor resolution in that the converging lines in both the negative and positive patterns were plugged in the area from 0-1, the lines in this area being approximately 0.001 inch in width. The element which had been stripped off the 0.00075 inch thick biaxially oriented and heat-set polyethylene terephthalate film cover sheet and coated with the aqueous dispersion showed no plugging or blocking in the 0-1area of converging lines, either in the negative or positive patterns thus demonstrating higher resolution when using the novel overcoating dispersions of this invention.

EXAMPLE XIII

An aqueous overcoat dispersion was prepared from the following ingredients as described below:

| Stock Solution: | |
|---|---|
| Low viscosity polyvinyl alcohol (99-100% hydrolyzed polyvinyl acetate | 60 g |
| Distilled water | 900 g |

The temperature was raised to 93.3° C and maintained until the polyvinyl alcohol was dissolved. The solution was then cooled and the following ingredients added thereto:

| | |
|---|---|
| Iso-octyl phenoxypolyethoxy ethanol (9-10 ethoxy groups, 10% aqueous solution) | 5 g |
| Ethyl alcohol | 5 g |
| Ethyl cellosolve | 5 g |
| Distilled water to | 1000 g |

OVERCOAT SOLUTIONS

The following solutions were prepared:

| Ingredient Added | Median* Particle Size (μ) | Sample A | B | C | D |
|---|---|---|---|---|---|
| Stock Solution | — | 200 g | 200 g | 200 g | 200 g |
| Co(vinyl pyrrolidone/ vinyl acetate, 60/40) mol. wt. 40,000-120,000, 5.7% solids in distilled $H_2O$ (See Ex. VI) | 0.6 | — | 21.2 | — | — |
| Teflon® T-30 (Du Pont Co.), aq. disp. of polytetrafluoroethylene, 5.7% solids in distilled $H_2O$ | 0.68 | — | — | 21.2 g | — |
| Tri-polymer of acrylonitrile (50%), butyl-acrylate (45%), methacrylic acid (5%), 48.3% solids in distilled $H_2O$ | 0.76 | — | — | — | 2.4 9 |

*Particle sizes were measured by a Coulter-Counter®, Coulter Electronics, Inc., Hialeah, Florida.

Four (4) aluminum plates bearing the photopolymerizable composition of Example 1 were overcoated with either Solution A, B, C or D to a coating weight of about 11 $mg/dm^2$ and the plates were thoroughly dried. The adhesion test (utilizing tape) described in Example I was performed on each sample with the following results:

| Sample | % Adhesion |
|---|---|
| A - Control - No Particles | 0 |
| B - Particles of this Invention | 54.2 |
| C - Teflon ® Particles | 14.6 |
| D - Acrylonitrile terpolymer Particles | 16.7 |

Samples of the above-referenced coatings were exposed and developed as described in Example I. All samples had equivalent photographic speed indicating good oxygen impermeability of the overcoats in all cases.

This example demonstrates the utility of the polymeric particles of this invention over those taught in the prior art and found in the overcoat of other photosensitive elements. The particles of this invention allow the utilization of a conventional oxygen impermeable layer while providing a unique advantage in improving the adhesive qualities of said layer to the photosensitive element which it is designed to protect.

I claim:

1. A photopolymerizable element comprising, in order, (1) a support, (2) a solid photopolymerizable stratum, and (3) an adherent, solid, protective stratum over the entire area of said photopolymerizable stratum transparent to actinic radiation, said protective stratum having a thickness of 0.2 to 25 microns and being characterized in that it is (i) nonstrippable as an unsupported film, (ii) substantially impermeable to oxygen, and (iii) water permeable and composed of a macromolecular organic polymer or polymer mixture which is soluble in water or in a mixture of water and a water-miscible organic solvent, said protective stratum having dispersed therein, solid particles of at least one water-insoluble vinyl polymer taken from the group consisting of vinyl pyrrolidone-vinyl acetate copolymer, vinyl acetate-methyl methacrylate copolymer, poly(ethyl acrylate), and poly(methyl methacrylate-ethyl acrylatemethacrylate acid) terpolymer, said particles being at least 0.05 micron in diameter and being present in amounts from 10 to 60 percent by weight of the total polymer in said protective stratum.

2. A photopolymerizable element of claim 1 wherein said photopolymerizable stratum is comprised of
   (a) at least one nongaseous ethylenically unsaturated monomeric compound containing at least one terminal ethylenic group, and being capable of forming an insoluble polymer by photoinitiated addition polymerization,
   (b) an addition polymerization initiating system activatable by actinic radiation, and
   (c) an organic macromolecular polymer binder for and compatible with said unsaturated monomeric compound.

3. A photopolymerizable element of claim 1 wherein said macromolecular organic polymer is selected from polyvinyl alcohol and copolymers and derivatives thereof, gelatin, and gum arabic.

4. A photopolymerizable element of claim 1 wherein said protective stratum contains colloidal silica.

5. A photopolymerizable element according to claim 1 wherein said support is a flexible sheet support having a hydrophilic surface.

* * * * *

UNITED STATES PATENT OFFICE
CERTIFICATE OF CORRECTION

PATENT NO. : 4,072,527

DATED : February 7, 1978

INVENTOR(S) : Roxy Ni Fan

It is certified that error appears in the above-identified patent and that said Letters Patent are hereby corrected as shown below:

| Column | Patent Line | |
|---|---|---|
| Heading | [75] | "Roxyni" should be -- Roxy Ni --. |
| 3 | 18 | "acrylatemethacrylic" should be -- acrylate-methacrylic --. |
| 7 | 56 | "acrylatemethacrylic" should be -- acrylate-methacrylic --. |
| 18 | 9 | "acrylatemethacrylate" should be -- acrylate-methacrylic --. |

Signed and Sealed this

*Twentieth* Day of *June 1978*

[SEAL]

*Attest:*

RUTH C. MASON
*Attesting Officer*

DONALD W. BANNER
*Commissioner of Patents and Trademarks*